Figure 1:
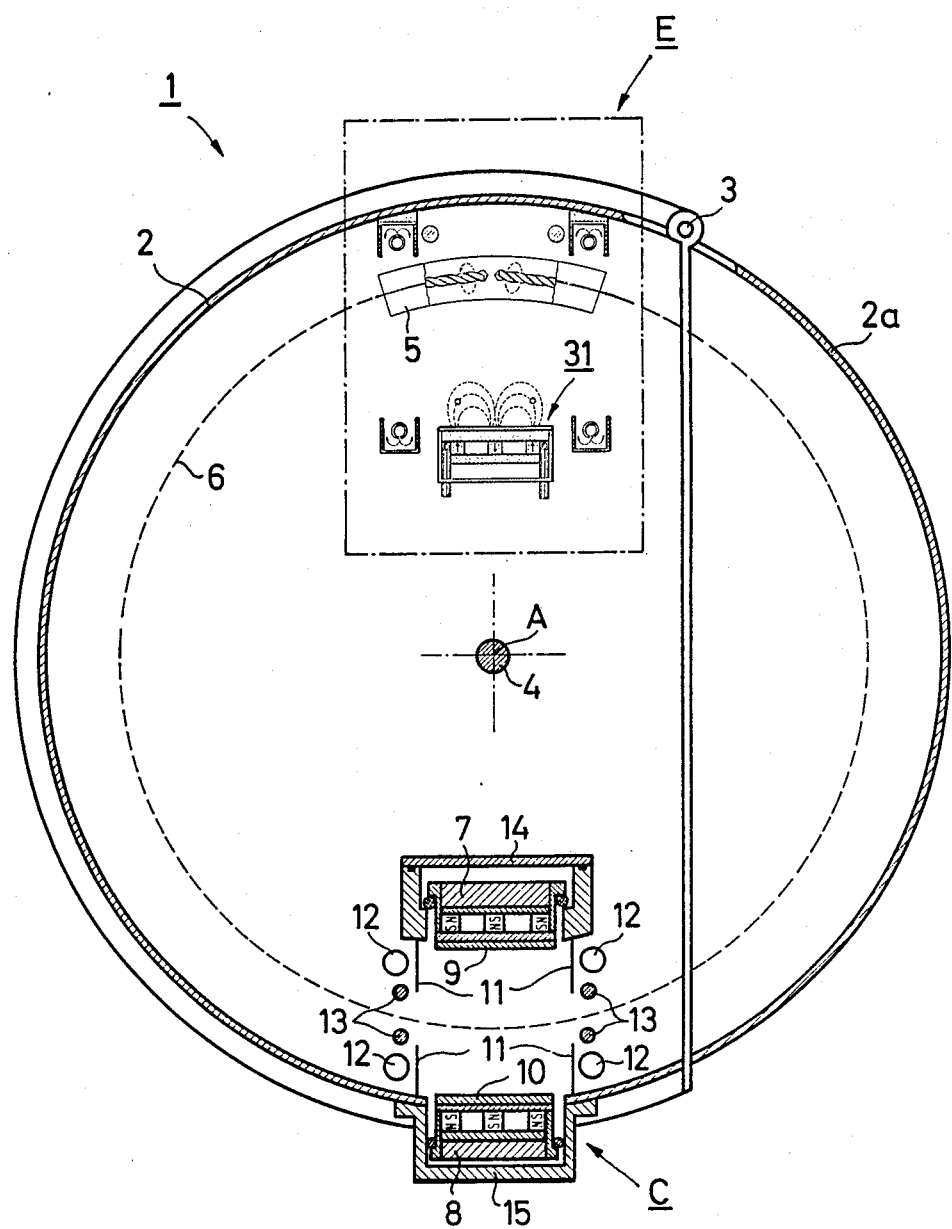

United States Patent [19]

Hensel et al.

[11] Patent Number: 4,911,784

[45] Date of Patent: Mar. 27, 1990

[54] METHOD AND APPARATUS FOR ETCHING SUBSTRATES WITH A MAGNETIC-FIELD SUPPORTED LOW-PRESSURE DISCHARGE

[75] Inventors: Bernd Hensel, Frankfurt am Main; Dieter Hofmann, Bruchköbel, both of Fed. Rep. of Germany

[73] Assignee: Leybold Aktiengesellschaft, Hanau, Fed. Rep. of Germany

[21] Appl. No.: 290,149

[22] Filed: Dec. 23, 1988

[30] Foreign Application Priority Data

Nov. 4, 1988 [DE] Fed. Rep. of Germany ....... 3837487

[51] Int. Cl.$^4$ .................. B44C 1/22; C03C 15/00; C03C 25/06
[52] U.S. Cl. ...................... 156/643; 134/1; 118/50.1; 118/623; 118/728; 156/626; 156/646; 156/656; 156/664; 156/345; 204/192.3; 204/298.37
[58] Field of Search ............... 156/626, 643, 646, 656, 156/664, 345; 204/192.1, 192.12, 192.13, 192.16, 192.3, 298 EE, 298 ME; 427/38, 39; 118/728, 50.1, 620, 623; 134/1

[56] References Cited

U.S. PATENT DOCUMENTS

| | | | |
|---|---|---|---|
| 4,126,530 | 11/1978 | Thornton | 204/298 EE |
| 4,581,118 | 4/1986 | Class et al. | 204/298 ME |
| 4,588,490 | 5/1986 | Cuomo et al. | 204/192.3 X |

Primary Examiner—William A. Powell
Attorney, Agent, or Firm—Felfe & Lynch

[57] ABSTRACT

An etching method whereby a sufficiently high etching rate is attained, in a uniform surface treatment that is very gentle on projecting edges of the substrates. Also the substrates are held at or brought to a sufficiently high temperature by the etching process. The method for etching substrates with a magnetic-field supported low-pressure discharge is characterized in that the magnetic field is decoupled from the substrates such that the magnetic field strength at the substrates is less than 6000 A/m. In the space between the substrates and the magnet system at least one electron emitter is disposed at a location at which a magnetic field strength is present that is greater than the field strength at the substrates but equal to or less than 12,000 A/m. On the side of the substrates facing away from the at least one electron emitter, at least one anode is disposed with an anode potential of +10 to +250 V with respect to ground. An etching potential between −100 V and −1000 V with respect to ground is applied to the substrates. The ratio of the gaps between the substrates and the surfaces of the substrates projected onto a projection plane carried through the gaps amounts to at least 0.1. The potential difference between the at least one emitter and the at least one anode is selected so high that an electron current (primary and secondary electrons) flows through the substrate gaps to the anode.

18 Claims, 8 Drawing Sheets

METHOD AND APPARATUS FOR ETCHING SUBSTRATES WITH A MAGNETIC-FIELD SUPPORTED LOW-PRESSURE DISCHARGE

The invention relates to a method for etching substrates with a magnetic-field-supported, low-pressure discharge. The etching is performed as a preliminary treatment of the substrates for a subsequent coating. What is important especially is the preliminary treatment of metal substrates in the manufacture of cutting tools which have ground cutting edges. The etching serves for the removal of oxide skins and corrosive deposits until a clean metal base material is achieved.

Such etching processes are basically known, also as preliminary treatments for the coating of cutting tools with so-called hard substances. In a double-cathode system in accordance with DE-OS 31 07 914, the attempt has been made to dispose the substrates during the etching phase between the cathodes and keeping them at an etching voltage of about $-1000V$; the cathodes making an secondary plasma available. The targets of the cathodes later to be coated are contaminated in this manner, so that they have to be sputtered free against a mask prior to the coating process. Such a measure is described in DE-OS 34 42 208.

With the known methods and apparatus, however, it is possible to establish only a low etching rate, corresponding to a current density of less than 1 mA per square meter of substrate surface. The etching process in this case is extremely time-consuming and in the case of sharp cutting edges and sharp edge geometries in high-speed steel tools damage is easily done to the edges.

In etching according to the state of the art, two diametrically opposed conditions must be observed: A high power density per square centimeter of substrate surface leads to a desirably great heating of the substrates. Substrate temperatures of about 400 to 500 deg. C are indispensable for the formation of hard and adherent carbide coatings on HSS steels. At a high power density of this kind, using the high substrate potentials of more than $-1000V$ required for this purpose, however, damage is often done to the cutting edges and thus an impairment of the operation of the tools to be coated. If the etch rates are reduced by a corresponding lowering of the power density, the result is the already-mentioned long etching time and great irregularity in the etching action on the parts to be etched. In other words: at poorly accessible points on the geometry of the substrates no etching takes place, and the coating afterward applied suffers from insufficient adhesion. Furthermore, the desired substrate temperature cannot be reached or maintained, so that a compromise must be found between a sufficiently high etching rate and minimal edge damage and sufficient adhesion.

This compromise cannot be achieved by the methods of the state of the art.

Complex substrate geometries require a certain ability of the plasma to penetrate into narrow or even undercut interstices. The same considerations apply to the penetration of the plasma into interstices between the parts being etched. In this connection the concept of the "dark-space interval" plays a part. The magnitude of the dark-space interval is dependent upon the potential difference between plasma and substrate and inversely proportional to the current density on the substrate. At a high potential difference and low current density, as commonly practiced in the conventional etching process, dark-space intervals of several millimeters occur, while with the lower potential differences and high current densities which are possible in accordance with the invention, dark-space intervals of less than one millimeter are achieved. Under such an assumption the plasma can penetrate much more easily into the substrate geometry, and therefore a more uniform etching process is achieved over the entire surface of substrates of complex shape.

Moreover, redeposition is prevented, i.e., particles from more readily etched surface portions, such as cutting edges and arrises, are prevented from condensing on poorly accessible surface portions such as drill flutes, from which they can no longer be removed, so that they lead to poor conditions for adhesion in the coating process that follows.

It is therefore the purpose of the invention to teach an etching method of the kind described above, whereby a sufficiently high etching rate is possible, in a uniform surface treatment that is very gentle on projecting edges. Furthermore, the substrates are to be held at or brought to a sufficiently high temperature by the etching process.

This purpose is accomplished in accordance with the invention, in the process described above, in that (a) The magnetic field is decoupled from the substrates such that the magnetic field strength in the area of the substrate is less than 6000 A/m, (b) In the space between the substrates and the magnet system at least one electron emitter is disposed at a point at which a magnetic field strength is present which is greater than the field strength at the substrates but is equal to or less than 12000 A/m, (c) On the side of the substrate facing away from the at least one electron emitter, at least one anode with an anode potential of $+10$ to $+250V$ with respect to ground as disposed, (d) An etching potential between $-100V$ and $-1000V$ with respect to ground is applied to the substrates, (e) The ratio of the interstices between the substrates and the projecting surfaces of the substrates on a plane of projection through the interstices amounts to at least 0.1, (f) The potential difference between the at least one emitter and the at least one anode is selected such that an electron current (primary and secondary electrons) flows from the emitter through the substrate interstices to the anode.

The magnetic field strengths to be selected, in accordance with the invention, are decidedly lower than the field strengths which occur under comparable geometrical conditions in magnetron cathodes which are used for coating purposes, i.e., for sputtering a target. The adaptation of the magnetic field strength in accordance with the invention can be performed in two ways: either the distance of the substrate and electron emitter from the magnetic field is changed, or magnetic field generators of appropriately reduced field strength are used. Of course, both measures can be performed simultaneously. If permanent magnets are used as the magnetic field producers, magnetic materials of an inherently lower field strength are preferably used. If electromagnets are used, the field strength can be controlled by the excitation current.

But also the potential ratios of electron emitter, substrates and anodes, in accordance with the invention, contribute decisively to making it possible to perform an etching process by means of a system which, with other parameters, constitutes a coating apparatus.

A decisive part is here played also by the ratio of the interstices between the substrates and the areas of the projection of the substrates onto a plane of projection carried through the interstices. For an understanding of this situation please refer to FIG. 8, where the plane of the drawing can be considered as plane of projection. On the one hand, the operator of such a process has an interest, of course, in having as many substrates as possible within a given area determined by the outline of the target; on the other hand he must of course see to it that the overall arrangement of the substrates transversely to the plane in which they are spread out will result in a certain "permeability" for the electron stream and assure a high ionization at the substrates themselves. If the distance between the individual substrates is very narrow and the said ratio is too small, these requirements will be hard to satisfy. In particular, surface etching on all sides will then be possible only if the individual substrates perform rotatory movements.

Again, the potential difference between the emitter and the anode will of course have a decisive influence on the electron current and on the ionization, i.e., the substrate arrangement on the one hand and the potential difference on the other must be carefully adjusted to one another.

If the process parameters in accordance with the invention, as well as certain geometrical conditions which in turn lead to process parameters, are fulfilled, an etching process can be sustained in accordance with the invention, which will result in an etching rate that is greater by a factor of 3 to 10 than the etching rate in the state of the art. The high power input also causes the substrates to be held at or brought up to a sufficiently high temperature. Despite high etching rates and high power, virtually no damage is done to edges or other projecting surface elements, so that, when the etching process in accordance with the invention is applied to cutting tools, their cutting properties are not impaired by the etching process. The relatively short etching time considerably improves the economy of the process. In particular, complex substrate geometries can be uniformly etched: the bottom of flutes of drills or mills can be etched just as clean as other surface parts. This results in better strength of adhesion of the hard coatings afterward applied during the coating operation.

The method in accordance with the invention is preferably performed in an etching atmosphere of pure noble gas, argon with a purity of 99.99% for example, but it is also possible advantageously, in the case of certain substances, to reduce the content of noble gas to 80% and to add at least one gas from the group, hydrogen, nitrogen, ammonia and oxygen, to enhance the etching process.

The power density is selected between 1 and 10 Watts per $cm^2$ of substrate area. The field strength of the magnetic field at the substrate is selected in an especially advantageous manner between 400 and 2000 A/m, the stated magnetic field strength always representing the total vector.

The strength of the magnetic field at the electron emitter is preferably chosen between 2000 and 5000 A/m, but in every case care must be taken to see that the magnetic field strength at the substrate is lower than it is at the electron emitter.

The anode potential is preferably set in a range between +20 and +120V.

To prevent a displacement effect in regard to the emitted electrons, the electron emitter is preferably heated with alternating current, the one foot of the emitter being at ground potential. The ground potential is advantageously applied also to an auxiliary electrode which is associated with the side of the emitter that faces away from the substrates.

The invention also relates to an apparatus for the practice of the method described above. Such an apparatus has, in a conventional manner, a vacuum chamber, a substrate holder and a moving system for the transport of the substrate holder on a given path of movement, as well as an electrical connection for the application of an etching potential negative with respect to ground to the substrate holder, and finally at least one anode for the removal of negative charges.

The transport of the substrate holder can be a continuous transport through the etching station, or it can be intermittent or stepped, and it is also possible to use the substrate holder only for the purpose of transporting the substrates into and out of the etching station. In some systems it may be desirable to rotate the substrates during the etching. More will be said about this in the detailed description.

To accomplish essentially the same purpose the above-described apparatus is characterized in accordance with the invention by the fact that, on the one side of the path of movement of the substrate holder, at least one electron emitter is disposed, and on the opposite side of the path of movement the at least one anode, that the distance "a" of the electron emitter from the path of movement is greater by at least a factor of 1.5 than the distance "b" of the anode from the path of movement, and that on the side of the electron emitter facing away from the path of movement a magnet system is disposed, the arrangement in space being such that the path of the substrate holder runs through a range of the field strength of the magnet system that is smaller than 6000 A/m, and that the electron emitter is situated on a range of the field strength of the magnet system that is greater than the field strength in range of the path but less than or equal to 12000 A/m.

It is especially advantageous if, between the magnet system and the electron emitter, an auxiliary electrode is disposed through which the lines of force of the magnet system pass such that the lines of force form a closed magnetic tunnel over the auxiliary electrode on the side facing the electron emitter. It is furthermore advantageous if, as seen from the path of the substrate holder, the at least one anode is disposed in front of the wall of the vacuum chamber, and if the at least one electron emitter with the auxiliary electrode faces the center of the vacuum chamber.

Additional advantageous configurations of the subject matter of the invention, and various alternative possibilities for the employment of the invention, will appear in the subordinate claims.

Embodiments of the subject matter of the invention will be further explained below in connection with FIGS. 1 to 8.

Figure 2:
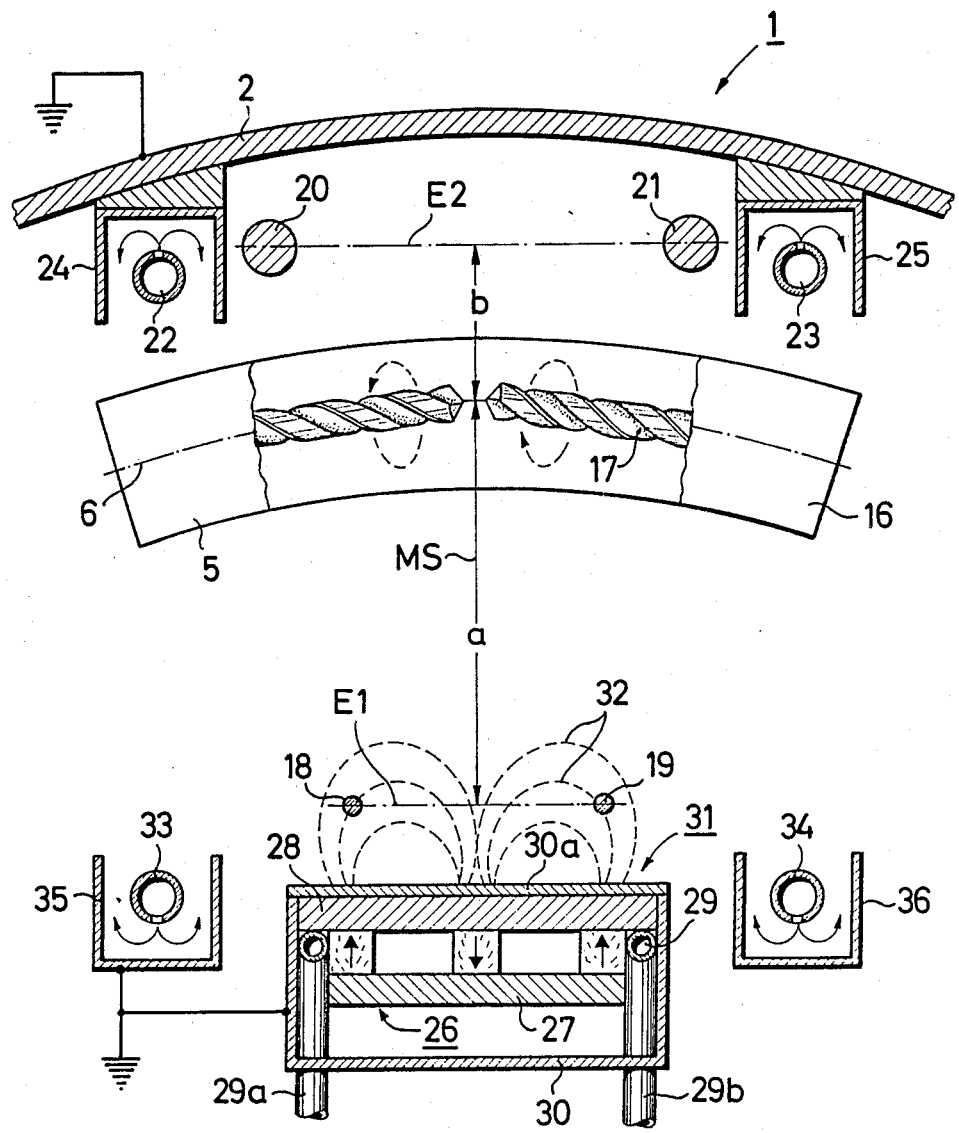
Figure 3:
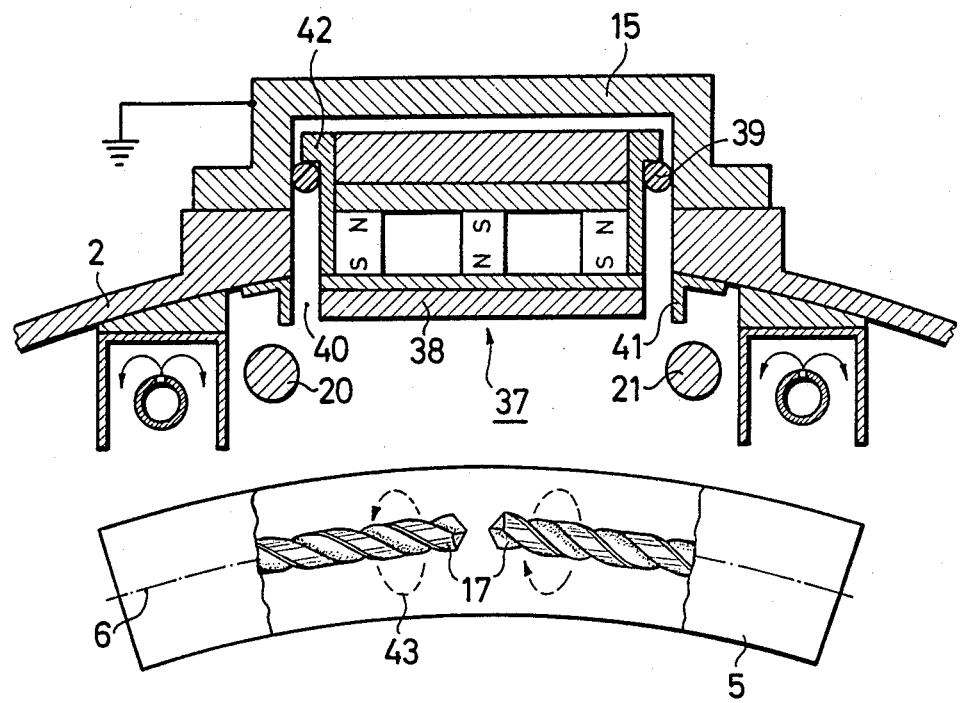
Figure 3:
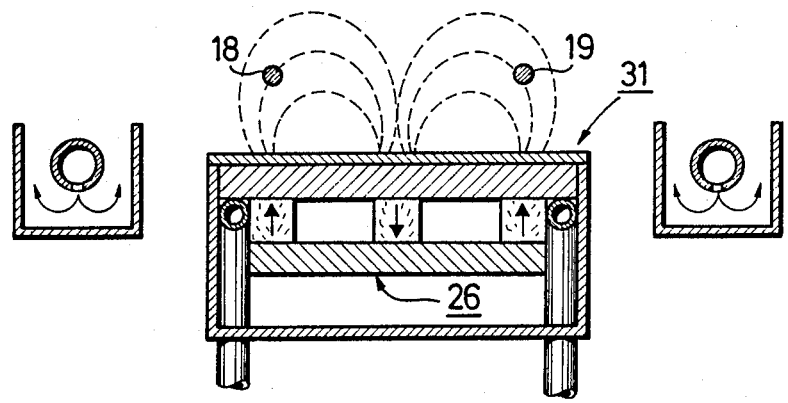
Figure 4:
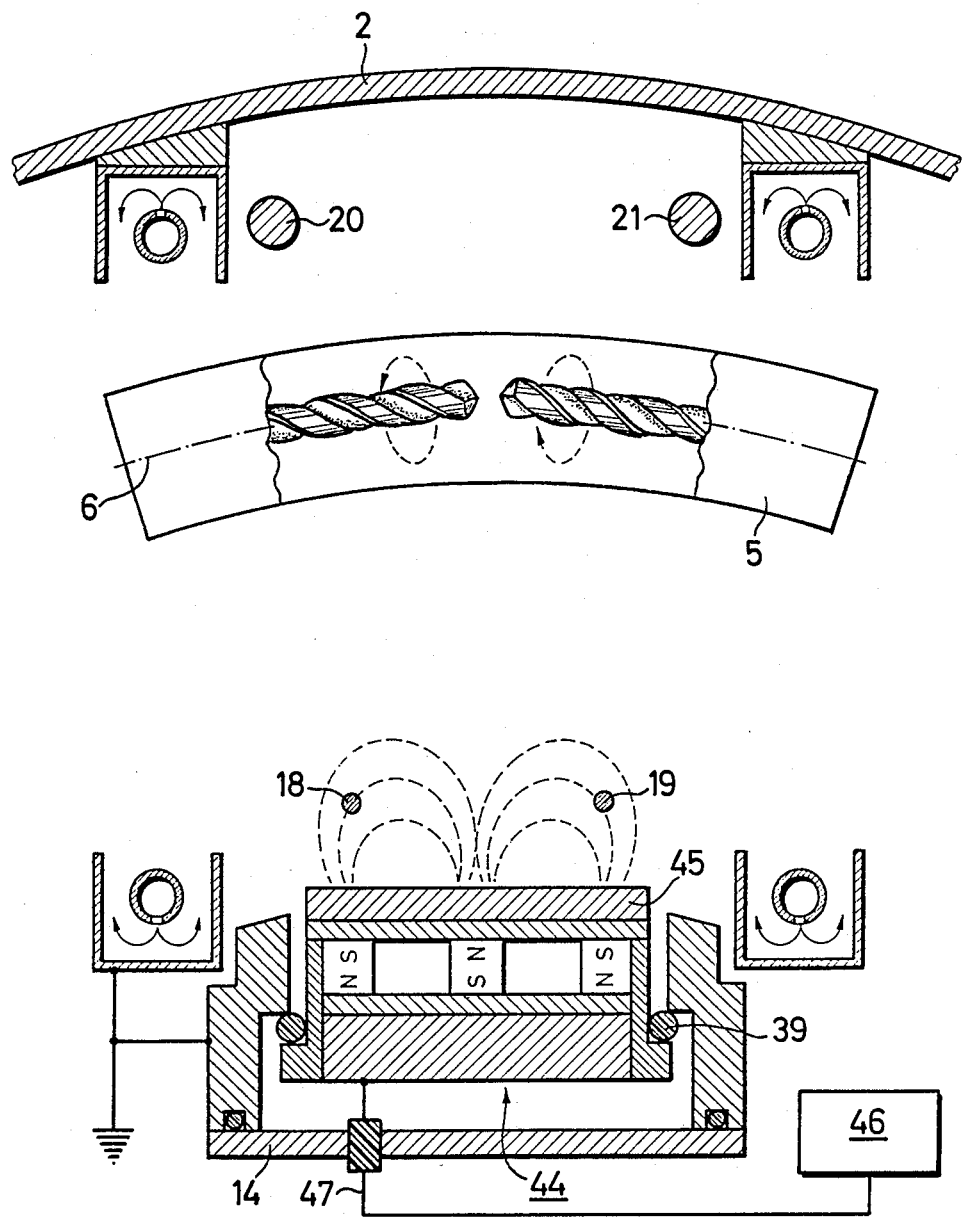
Figure 5:
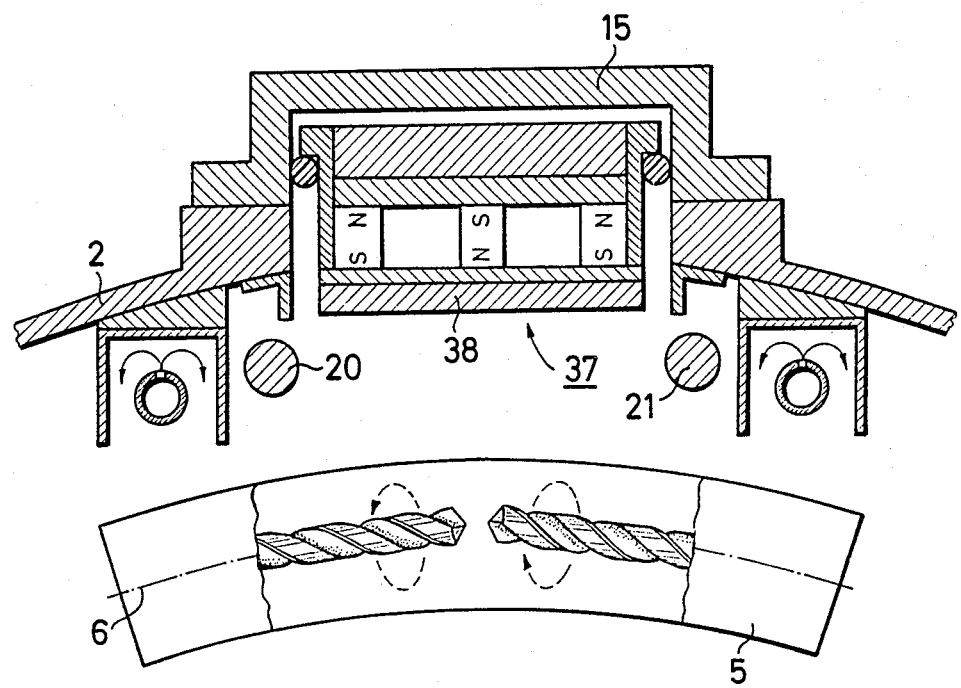
Figure 5:
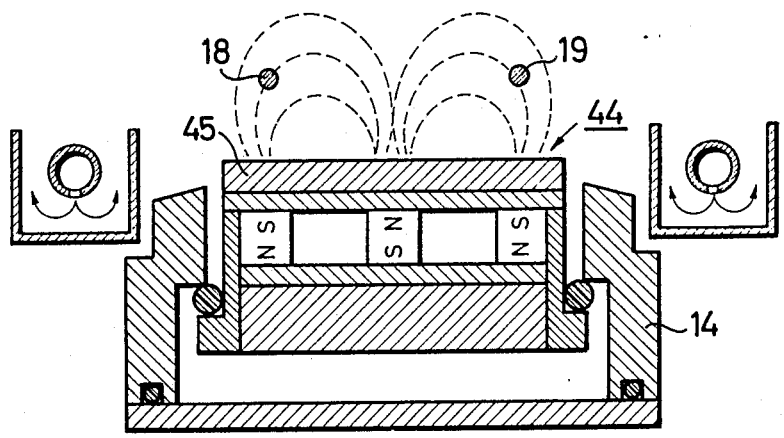
Figure 6:
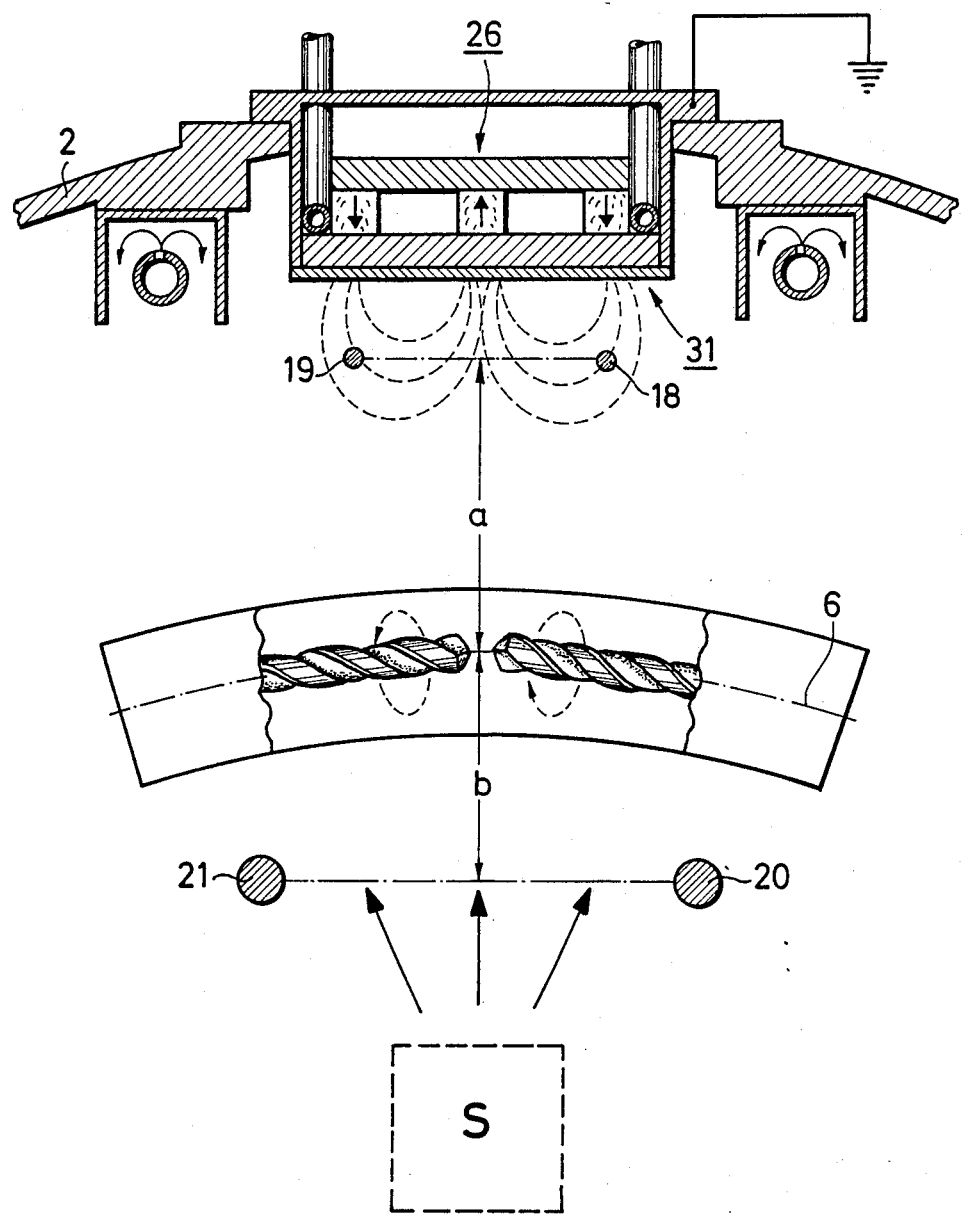
Figure 7:
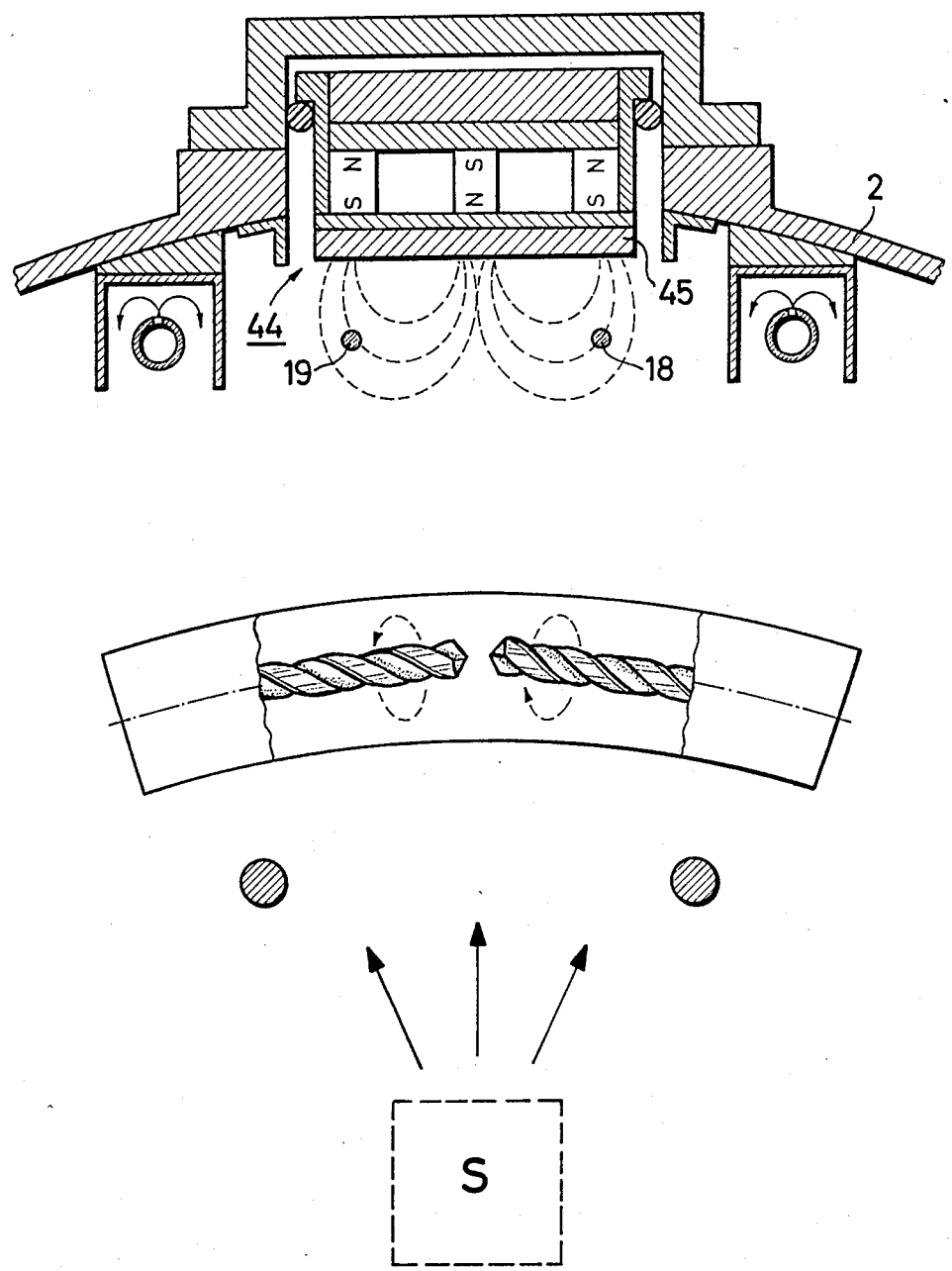
Figure 8:
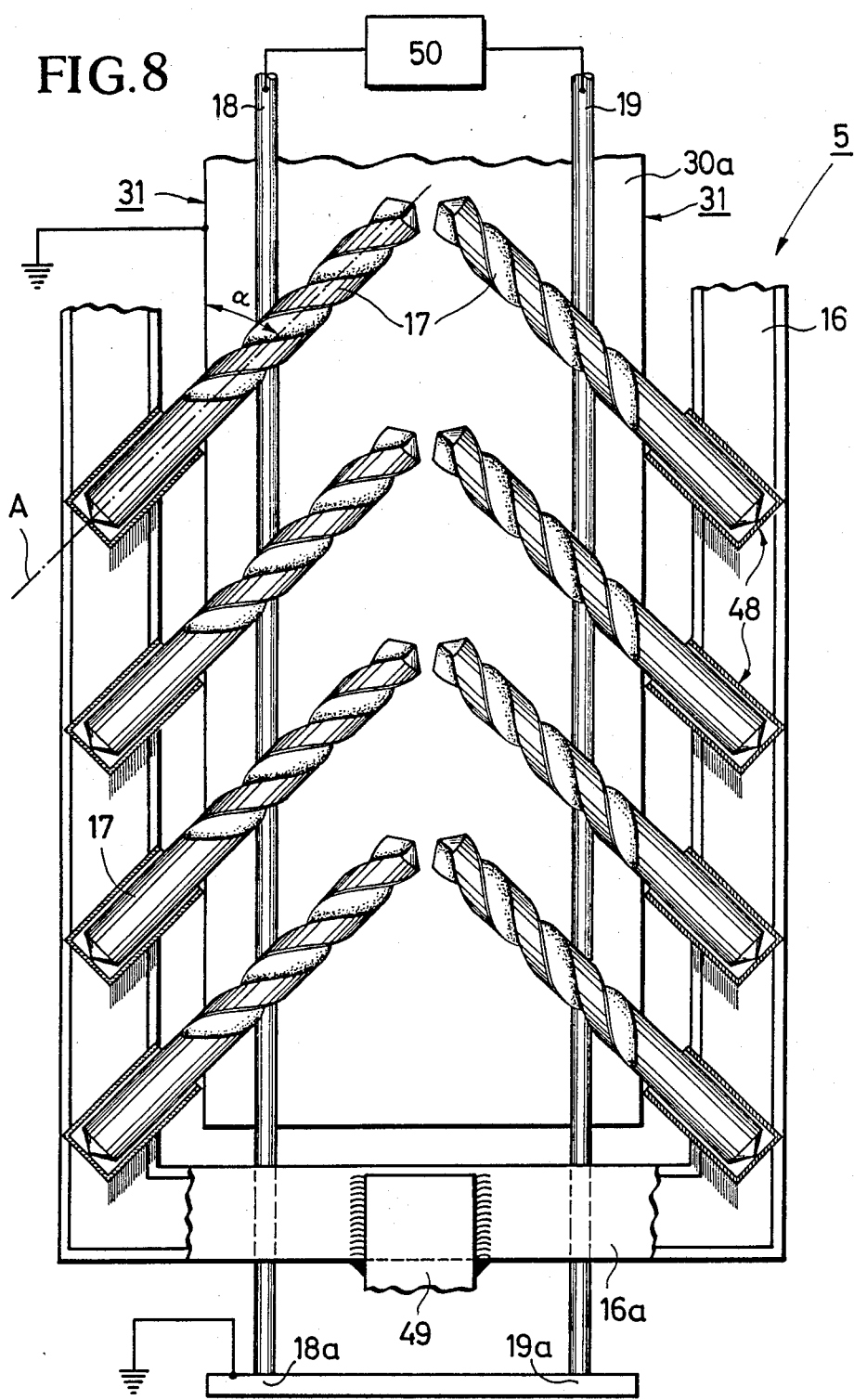

FIG. 1 shows a horizontal section through a vacuum apparatus with a vertical chamber axis and two stations for the alternate etching and coating of substrates (the part that is important to the invention is marked off by the rectangle in broken lines), FIG. 2 is an enlarged view of the section within the dash-dotted rectangle in FIG. 1, FIG. 3 is a further development of the subject matter of FIG. 2 achieved by adding a magnetron sputtering cathode in the wall of the vacuum chamber, FIG. 4 is a variant of the subject of FIG. 2, in which the auxiliary electrode with magnet system is replaced by a magnetron cathode with a target, FIG. 5 is an expansion of the subject matter of FIG. 4, which has been supplemented by the addition of a second magnetron cathode similar to FIG. 3, FIG. 6 is an inversion of the principle of construction of FIG. 3, in which the auxiliary electrode with magnet system and electron emitters have been inserted into the wall of the vacuum chamber, while the source S of the coating material has been shifted into the interior of the chamber, FIG. 7 is a variant of the subject of FIG. 6, in which the auxiliary electrode has been replaced by a magnetron cathode with a target, and FIG. 8 is a side view of a substrate holder loaded with substrates (drills).

In FIG. 1 is represented a vacuum chamber 1 which has a cylindrical wall 2 with a vertical axis. A sector-shaped portion of this chamber wall is separate from the latter and forms a door 2a which is connected by a hinge 3 to the vacuum chamber.

The vacuum chamber includes a driving system, not shown here, which has a coaxial shaft 4, by which a substrate holder 5, which is shown in greater detail in FIG. 8, can be carried on a circular path 6. The shaft 4 is mounted on insulation in a manner not shown and provided with an electrical connection to enable an etching potential that is negative with respect to ground to be applied to the substrate holder.

On the path of movement 6, and in substantial mirror-image symmetry therewith, there is disposed a coating station C which in itself is state-of-the-art and therefore will be explained but briefly. The coating station C has two magnetron cathodes 7 and 8 of known type with targets 9 and 10 made from the coating material. If, as in the present case, the precipitated coatings consist of a chemical compound, such as titanium nitride, the targets 9 and 10 will then consist of titanium and they are sputtered in a reactive atmosphere in the presence of nitrogen. The reaction space between the targets is shielded by masks 11 except for a gap to accommodate the passage of the substrate holder 5. Gas distribution tubes 12 serve to supply the reaction gas, and the system is completed by anodes 13 into which the electrons proceeding from the discharge enter. The magnetron cathode 7 is inserted into a cathode case 14 which envelops the magnetron cathode also at the sides, leaving a gap whose width is narrower than the dark space interval given under the conditions of operation. In like manner, the magnetron cathode 8 is housed in a cathode case 15 which is inserted vacuum-tight into the chamber wall 2. It is to be understood that a plurality of such coating stations C can be disposed on the circumference of the path of movement 6.

On the side opposite the coating station C is the etching station E, circumscribed with a dash-dotted line. This etching station will be explained in detail with the aid of FIG. 2 in connection with FIG. 8.

As seen in FIG. 2, the substrate holder 5 is moved along its path 6. It has a frame 16 in which several substrates 17 are inserted, in accordance with FIG. 8. In the example in the drawing, they are drills which are held in a herringbone pattern in the frame 16, the axes of the drills being slightly tangential to a cylindrical surface in which the path 6 lies. This will serve to define sufficiently the slightly curved geometry of the top and bottom sides of the frame 16.

On the one side of the path of movement 6 of the substrate holder, two electron emitters 18 and 19 are arranged in the direction of the axis A of the vacuum chamber 1, while on the opposite side of the path 6, two anodes 20 and 21 are disposed. The system is arranged as follows: If two parallel planes E1 and E2, represented in the drawing as dash-dotted lines, are laid through the axes of the emitters on the one hand and the anodes on the other, and if the central perpendicular MS common to both lines is drawn on both sides, this central perpendicular line MS becomes divided by the path 6 into a larger and a smaller section. The larger section corresponds to the distance a of the electron emitters from the path of movement and is longer by a factor of at least 1.5 than the other section which corresponds to the spacing b of the anodes from the path of movement. The entire arrangement in accordance with FIG. 2 is in a mirror-image symmetry about the central perpendicular MS.

The anodes 20 and 21 are in the form of cylindrical rods whose axes are spaced 95 mm apart from one another and about 20 mm from the chamber wall 2. The length of the anodes 20 and 21 corresponds at least to the height of the substrate holder 5 shown in FIG. 8. The ends of the anodes 20 and 21 are mounted with insulation in the vacuum chamber 1 and connected to a voltage source.

The anode pair 20/21 is disposed between gas distributing tubes 22 and 23 whose numerous gas discharge openings are directed at the chamber wall 2. Each gas distributing tube is surrounded by a channel-shaped guide 24 and 25, respectively, so that the introduced gas or gas mixture is guided toward the path of movement 6 and the substrate holder 5.

On the side of the electron emitters 18 and 28 facing away from the path 6 is a magnet system consisting of a plurality of permanent magnets and a ferromagnetic yoke plate 27. The permanent magnets are not numbered, but their opposite polarity is indicated by arrows. The free pole faces of the permanent magnet abut against a plate 28 consisting of copper, onto which there is soldered a coolant line 29 with connections 29a and 29b. The entire magnet system 26 is surrounded by a case 30 consisting of high-grade steel, which is at ground potential.

The magnet system 26 forms in plan (radially) along the central perpendicular MS an arrangement one inside the other of magnet poles of opposite polarity which produce a magnetic tunnel in the form of an oval or racetrack closed on the circumference. This magnetic tunnel is indicated by the arcuate broken lines which rise from the surface of the auxiliary electrode 31 and return thereto. The electron emitters 18 and 19 have a very specific position in this magnetic field 32 which is defined by the amount of the field strength in accordance with the teaching of the invention. In any case the field strength at the substrates 17 is decidedly lower.

The auxiliary electrode 31 is also framed in on both sides by gas distributing tubes 33 and 34 which in turn are surrounded again by channel-shaped guides 35 and 36, the arrangement being such in this case, too, that the gas or gas mixture first issues rearwardly from the gas distributing tubes 33 and 34 (with respect to the emitters 18 and 19), but then is deflected by the guides 35 and 36 toward the path of movement 6.

An important part of the auxiliary electrode 31 is the front plate 30a of the case 30 facing the emitters 18 and 19. This front plate is, in any case, disposed between the magnet system 26 and the emitters 18 and 19. At the center of the vacuum chamber is the shaft 4 which is situated behind the auxiliary electrode, in accordance with FIG. 1.

In the embodiment in accordance with FIG. 3, a magnetron cathode 37 with a target 38 consisting of coating material is situated on the side of the anodes 20 and 21 in the wall 2 of the vacuum chamber. This is a magnetron quite similar to the one represented in FIG. 1, at the bottom.

The magnetron cathode 37 is held in the cathode case 15 by an insulator 39 which serves simultaneously as a seal, leaving an air gap 40 whose width is less than the "dark space interval" that is established under the usual operating conditions. For the lateral confinement of the target 38, angular grounding shields 41 are disposed at equal distance on the chamber wall 2. This assures that no glow discharge will form on the circumference of the cathode body 42 and of the target 38.

The magnetron cathode 37 in FIG. 3 serves for coating the substrates 17 when the etching process is completed. While the substrates 17 (drills) do not need to be rotated during the etching process, they must be rotated in the sense of the broken arrows 43 during the coating process on account of the unilaterally acting magnetron cathode 37.

In the embodiment in accordance with FIG. 4, the upper part is no different from FIG. 2. The auxiliary electrode 31 with the magnet system 26, however, is replaced by a magnetron cathode 44 on the side of the emitters 18 and 19 facing away from the path of movement 6. This magnetron cathode 44 also bears a target 45 consisting of coating material. The magnetron cathode 44 is likewise held on an insulator 39 in the cathode case 14 and is connected by a conductor 47 to a variable voltage source 46. An arrangement of this kind can be switched from etching to coating. The etching process is performed at a cathode potential of 0–300V. By increasing this cathode potential to about 400–700V and increasing the power density from 1 Watt/cm² to about 5–20 Watts/cm² (with respect to the target surface) the etching process can be changed to a coating process. During the etching phase the target 45 acts to a certain extent as the auxiliary electrode.

In the embodiment represented in FIG. 5, magnetron cathodes 37 (FIG. 3) and 44 (FIG. 4) are disposed on both sides of the path of mvoement 6 in a confronting arrangement, and are provided with targets 38 and 45, respectively. At least one of the magnetron cathodes is connected, in a manner similar to FIG. 4, to a variable voltage source whose output voltage can be switched from etching to coating. The two electron emitters 18 and 19 are associated with the magnetron cathode in a manner similar to FIG. 4, while the anodes 20 and 21 are associated with magnetron cathode 37. The spatial position of the emitters 18 and 19 and of anodes 20 and 21 relative to the path of movement 6 is otherwise the same as that shown in FIG. 2, especially in regard to the distance ratio a:b.

In the embodiment shown in FIG. 6, the spatial position is essentially the reverse of that in FIG. 3, i.e., the otherwise completely identical auxiliary electrode 31 with the magnet system 26 is now inserted into the chamber wall 2. The emitters 18 and 19 are in front of them, again as in FIG. 3. The two anodes 20 and 21 are now disposed on the side of the path 6 opposite the emitters 18 and 19. The coating source "S" disposed behind the anodes is now represented only very roughly, and can be a vacuum evaporator, an ion source, or the like.

In the embodiment shown in FIG. 7, the electron emitters 18 and 19 are likewise disposed on the side of the path 6 that faces the chamber wall 2. As seen from the path 6, a magnetron cathode 44, which is the same as the one at the bottom in FIG. 4, is disposed on the chamber wall 2 in back of the emitters 18 and 19, and is provided with a target 45. This magnetron cathode is again connected, in a manner not represented, to a variable voltage source 46, as is represented in FIG. 4 at the bottom. The apparatus can be switched from "etching" to "coating" by appropriately changing the output voltage of voltage source 46.

FIG. 8 shows the bottom part of the fram 16 of the substrate holder 5 with a plurality of sockets 48 whose axes are at an angle a to the perpendicular. In the present case, the substrates 17 are so-called twist drills, which the angular positions of the sockets 48 are arrayed in a herringbone pattern. The bottom fram side 16a is provided with a shank 49 which in turn is removably inserted into a mounting which is fastened to shaft 4 (FIG. 1). FIG. 8 also shows the outline of the auxiliary electrode 31 or front plate 30a, as the case may be, and it shows also the two electron emitters 18 and 19 which run vertically in the form of elongated wires in front of the front plate 30a and parallel thereto. The feet 18a and 19a of the emitters are connected to ground, while the two upper ends are connected to a current source 50, so that the two emitters can be heated to temperatures at which an appreciable electron emission takes place.

All targets, magnetron cathodes, auxiliary electrodes, etc., have a rectangular profile whose longest axis is perpendicular. Also the substrate holder frame 16 has a vertically disposed longest axis, and the emitters 18 and 19 and anodes 20 and 21 are of such a length that they extend through the entire etching system.

EXAMPLE

In a vacuum etching and coating apparatus Model Z 700 of Leybold Aktiengesellschaft in Hanau, Federal Republic of Germany, which was especially equipped in accordance with FIGS. 1, 2 and 8, twist drills with a diameter of 8 mm were first etched and then coated with a hard coating of titanium aluminum nitride.

The drills were degreased with dichloromethane and cleaned in alkaline solutions, and lastly dried in a fluorochlorinated hydrocarbon. The drills were then inserted into the substrate holders in accordance with FIG. 8. The vacuum chamber 1 was first evacuated to a pressure of $10^{-5}$ and then argon with a purity of 99.99% was admitted until the pressure in the vacuum chamber was $2 \times 10^{-2}$.

The axial distance between the anodes 20 and 21 was 95 mm, and the axial distance between the two emitters 18 and 19 was 60 mm. The dimension a was 85 mm, dimension b 40 mm. The distance between the plan E1 through the emitters 18 and 19 from the front plate 30a was 20 mm, and plane E1 was 30 mm away from the pole faces of the permanent magnets. The width of the auxiliary electrode 31 was 80 mm, and its length (vertically) 500 mm.

The anode potential was set at +60V, and a voltage of −500V was applied to the substrates. The field strength of the magnetic field at the substrates amounted to 600 A/m, while the field strength at the electron emitters was 3500 A/m. During the entire etching operation, which extended over a period of 4 minutes, a power density of 2 watts/cm$^2$ of substrate area was established. The result was a perfect etching which extended over the entire surface of the drills, and in which no damage was done to the cutting edges.

In a subsequent coating process the drills were coated with a layer of titanium aluminum nitride (TiAlN$_x$). Stress tests showed that the titanium aluminum nitride coating had no tendency to separate.

We claim:

1. Method for etching substrates with a magnetic field-supported low-pressure discharge, comprising:
    (a) decoupling a magnetic field from substrates such that the magnetic field strength at the substrates is less than 6000 A/m,
    (b) disposing in the space between the substrates and a magnet system at least one electron emitter at a location at which the magnetic field strength is present that is greater than the field strength at the substrates but equal to or less than 1200 A/m,
    (c) disposing, on the side of the substrates facing away from the at least one electron emitter, at least one anode with an anode potential of +10 to +250V with respect to ground;
    (d) applying an etching potential between −100V and −1000V with respect to ground to the substrates,
    (e) the ratio of the gaps between the substrates and the surfaces of the substrates projected onto a projection plane carried through the gaps amounting to at least 0.1,
    (f) determining the potential difference between the at least one emitter and the at least one anode so high that an electron current (primary and secondary electrons) flows through the substrate gaps to the anode.

2. Method in accordance with claim 1, which includes performing etching in an atmosphere containing at least 80% of a noble gas.

3. Method in accordance with claim 1, which includes adding at least one gas from the group, hydrogen, nitrogen, ammonia and oxygen, to an etching gas.

4. Method in accordance with claim 1, which includes performing etching at a power density between 1 and 10 watts per square centimeter of substrate surface.

5. Method in accordance with claim 1, which includes determining a field strength of the magnetic field at the substrate between 400 and 2000 A/m (total vector).

6. Method in accordance with claim 1, which includes determining a field strength of the magnetic field at the electron emitter between 2000 and 5000 A/m.

7. Method in accordance with claim 1, which includes setting the anode potential between +20 and +120 volts.

8. Method in accordance with claim 1, which includes heating the at least one electron emitter with alternating current and connecting a base to ground potential.

9. Method in accordance with claim 1, which includes connecting to ground potential an auxiliary electrode disposed on the side of the at leaast one emitter facing away from the substrates.

10. Method in accordance with claim 1, which includes providing a gas pressure of an etching atmosphere amounting to at least $5 \times 10^{-3}$ mbar.

11. Apparatus for the practice of the method for etching substrates with a magnetic field-supported low-pressure discharge, comprising decoupling a magnetic field from substrates such that the magnetic field strength at the substrates is less than 6000 A/m, disposing in the space between the substrates and a magnet system at least one electron emitter at a location at which a magnetic field strength is present that is greater than the field strength at the substrates but equal to or less than 12000 A/m, disposing, on the side of the substrates facing away from the at least one electron emitter, at least one anode with an anode potential of +10 to +250V with respect to ground, applying an etching potential between −100V and −1000V with respect to ground to the substrates, the ratio of the gaps between the substrates and the surface of the substrates projected onto a projection plane carried through the gaps amounting to at least 0.1, determining the potential difference between the at least one emitter and the at least one anode so high that an electron current (primary and secondary electrons) flows through the substrate gaps to the anode,
    the apparatus comprising a vacuum chamber, a substrate holder, and a moving system for the transport of the substrate holder on a given path of movement, a current connection for supplying the substrate holder with an etching potential negative with respect to ground, and an anode for the removal of negative charges, at least one electron emitter being disposed on one side of the path of movement of the substrate holder and the at least one anode being disposed on the opposite side of the path of movement, the distance "a" of the electron emitter from the path of movement being greater by at least the factor 1.5 than the distance "b" of the anode from the path of movement, and a magnet system being disposed on the side of the electron emitter that faces away from the path of movement, the arrangement in space being made such that the path of movement of the substrate holder passes through an area of the field strength of the magnet system that is less than 6000 A/m, and that the electron emitter is situated in an area of the field strength of the magnet system that is greater than the field strength at the path of movement, but equal to or less than 12,000 A/m.

12. Apparatus in accordance with claim 11, in which between the magnet system and the electron emitter an auxiliary electrode is disposed, through which the lines of force of the magnet system penetrate such that the lines of force on the side facing the electron emitter form a closed magnetic tunnel over the auxiliary electrode.

13. Apparatus in accordance with claim 11, in which, as seen from the path of movement of the substrate holder, the at least one anode is disposed in front of a wall of the vacuum chamber and that the at least one electron emitter with the auxiliary electrode faces the center of the vacuum chamber.

14. Apparatus in accordance with claim 13, in which a magnetron cathode with a target consisting of coating material is disposed on the side of the at least one anode on the wall of the vacuum chamber.

15. Apparatus in accordance with claim 11, which includes a variable voltage source and in which a magnetron cathode with a target consisting of coating material is disposed on the side of the at least one emitter facing away from the path of movement and in which the magnetron cathode is connected to the variable voltage source whose output voltage can be switched from "etching operation" of the apparatus to "coating operation".

16. Apparatus in accordance with claim 15, in which on each side of the path of movement one magnetron cathode provided with a target consisting of coating material is disposed, at least one magnetron cathode being connected to the variable voltage source whose output voltage can be switched from "etching operation " to "coating operation".

17. Apparatus in accordance with claim 12, in which at least one electron emitter is disposed on the side of the path of movement which faces a wall of the vacuum chamber, in which the auxiliary electrode, as seen from the path of movement, is fastened to the said wall behind the electron emitter, and in which the at least one anode is disposed on the side of the path of movement facing the center of the vacuum chamber.

18. Apparatus in accordance with claim 12, which includes a variable voltage source and in which the at least one electron emitter is disposed on the side of the path of movement facing a wall of the vacuum chamber, and in which, as seen from the path of movement, a magnetron cathode with a target consisting of coating material is fastened behind the electron emitter on the wall of the vacuum chamber and in which the magnetron cathode is connected to the variable voltage source whose output voltage can be switched from "etching operation" of the apparatus to "coating operation".

* * * * *

UNITED STATES PATENT AND TRADEMARK OFFICE
CERTIFICATE OF CORRECTION

PATENT NO. : 4,911,784

DATED : March 27, 1990

INVENTOR(S) : Hensel et al.

It is certified that error appears in the above-identified patent and that said Letters Patent is hereby corrected as shown below:

Column 8, line 63 for "plan E1" read

-- plane E1 --.

Column 9, line 25 for "1200 A/m" read

-- 12000 A/m --.

Signed and Sealed this

Twenty-fifth Day of February, 1992

Attest:

*Attesting Officer*

HARRY F. MANBECK, JR.

*Commissioner of Patents and Trademarks*